US011242791B2

(12) United States Patent
Kawaguchi et al.

(10) Patent No.: US 11,242,791 B2
(45) Date of Patent: Feb. 8, 2022

(54) HEAT RECOVERY DEVICE AND HEAT RECOVERY SYSTEM WITH A THERMOELECTRIC MODULE

(71) Applicant: NGK INSULATORS, LTD., Nagoya (JP)

(72) Inventors: Tatsuo Kawaguchi, Nagoya (JP); Daisuke Kimura, Nagoya (JP); Makoto Yoshihara, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 6 days.

(21) Appl. No.: 16/722,796

(22) Filed: Dec. 20, 2019

(65) Prior Publication Data

US 2020/0141299 A1   May 7, 2020

Related U.S. Application Data

(63) Continuation of application No. PCT/JP2018/025940, filed on Jul. 9, 2018.

(30) Foreign Application Priority Data

Aug. 2, 2017 (JP) .............................. JP2017-150200

(51) Int. Cl.
*F01N 5/02* (2006.01)
*H01L 35/32* (2006.01)
*F28D 21/00* (2006.01)

(52) U.S. Cl.
CPC .............. *F01N 5/025* (2013.01); *H01L 35/32* (2013.01); *F01N 2240/02* (2013.01);
(Continued)

(58) Field of Classification Search
CPC ..................................... F01N 5/025
See application file for complete search history.

(56) References Cited

U.S. PATENT DOCUMENTS 3,197,342 A       7/1965  Neild, Jr.
8,424,296 B2 *    4/2013  Burgers ................ F28D 9/0012
                                                            60/298
(Continued)

FOREIGN PATENT DOCUMENTS

CN           106183924 A   * 12/2016
DE      202010003049 U1   *  7/2010  ............. F01N 5/025
(Continued)

OTHER PUBLICATIONS

K.M. Saqr, et al., "Thermal Design of Automobile Exhaust Based Thermoelectric Generators: Objectives and Challenges," *International Journal of Automotive Technology*, vol. 9, No. 2, (2008), pp. 155-160.
(Continued)

*Primary Examiner* — Laert Dounis
(74) *Attorney, Agent, or Firm* — Burr & Brown, PLLC

(57) ABSTRACT

A heat recovery device, including a pillar-shaped honeycomb structure comprising an outer peripheral side wall having one or more planar outer peripheral side surfaces; one or more thermoelectric conversion modules arranged to face the one or more planar outer peripheral side surfaces; a tubular member that circumferentially covers the outer peripheral side surfaces of the honeycomb structure and the one or more thermoelectric conversion modules; and a casing that circumferentially covers the tubular member; wherein the partition walls are mainly configured of ceramics; and wherein the casing has an inflow port and an outflow port for a second fluid having a temperature lower than that of the first fluid, and a flow path for the second fluid is formed circumferentially around the tubular member between an inner surface of the casing and an outer surface of the tubular member.

19 Claims, 16 Drawing Sheets

(52) U.S. Cl.
CPC ...... *F01N 2470/08* (2013.01); *F28D 21/0003* (2013.01); *Y02T 10/12* (2013.01)

(56) References Cited

U.S. PATENT DOCUMENTS

| | | | |
|---|---|---|---|
| 9,145,812 B2* | 9/2015 | An | F01N 5/025 |
| 2005/0172992 A1 | 8/2005 | Shimoji et al. | |
| 2011/0146743 A1 | 6/2011 | Oesterle et al. | |
| 2012/0073276 A1* | 3/2012 | Meisner | H01L 35/30 60/320 |
| 2012/0247732 A1 | 10/2012 | Suzuki et al. | |
| 2015/0280097 A1* | 10/2015 | Jinushi | H01L 35/30 136/205 |
| 2016/0215674 A1 | 7/2016 | Mittal et al. | |
| 2018/0230884 A1 | 8/2018 | Kawaguchi et al. | |

FOREIGN PATENT DOCUMENTS

| | | | | |
|---|---|---|---|---|
| JP | H07-003156 U | | 1/1995 | |
| JP | H10-290590 A1 | | 10/1998 | |
| JP | H1155973 A | * | 2/1999 | |
| JP | 2000018095 A | * | 1/2000 | F01N 5/025 |
| JP | 2000-232244 A1 | | 8/2000 | |
| JP | 2005-210782 A1 | | 8/2005 | |
| JP | 2005-223132 A1 | | 8/2005 | |
| JP | 2005210782 A | * | 8/2005 | |
| JP | 2008-035595 A1 | | 2/2008 | |
| JP | 2008-128128 A1 | | 6/2008 | |
| JP | 2008223758 A | * | 9/2008 | |
| JP | 2008274790 A | * | 11/2008 | F01N 11/002 |
| JP | 2011-127606 A1 | | 6/2011 | |
| JP | 2013-110825 A1 | | 6/2013 | |
| JP | 2014-127617 A1 | | 7/2014 | |
| KR | 20130068022 A | * | 6/2013 | F01N 5/025 |
| WO | 2011/071161 A1 | | 6/2011 | |
| WO | 2017/069265 A1 | | 4/2017 | |

OTHER PUBLICATIONS

International Search Report and Written Opinion (Application No. PCT/JP2018/025940) dated Sep. 11, 2018.
English Translation of the International Preliminary Report on Patentability (Chapter 1) (Appl. No. PCT/JP2018/025940) dated Feb. 13, 2020, 13 pages.

* cited by examiner

[FIG. 1-1]
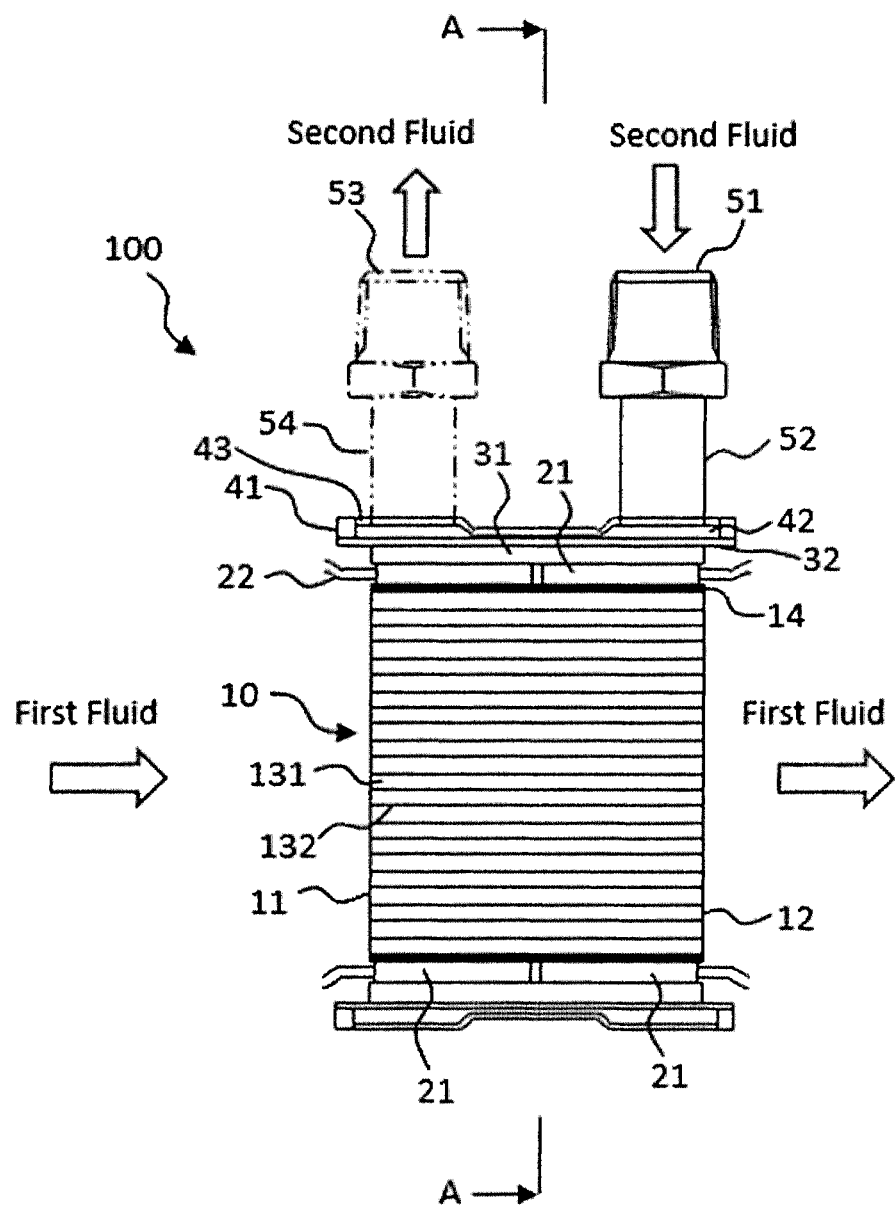

[FIG. 1-2]
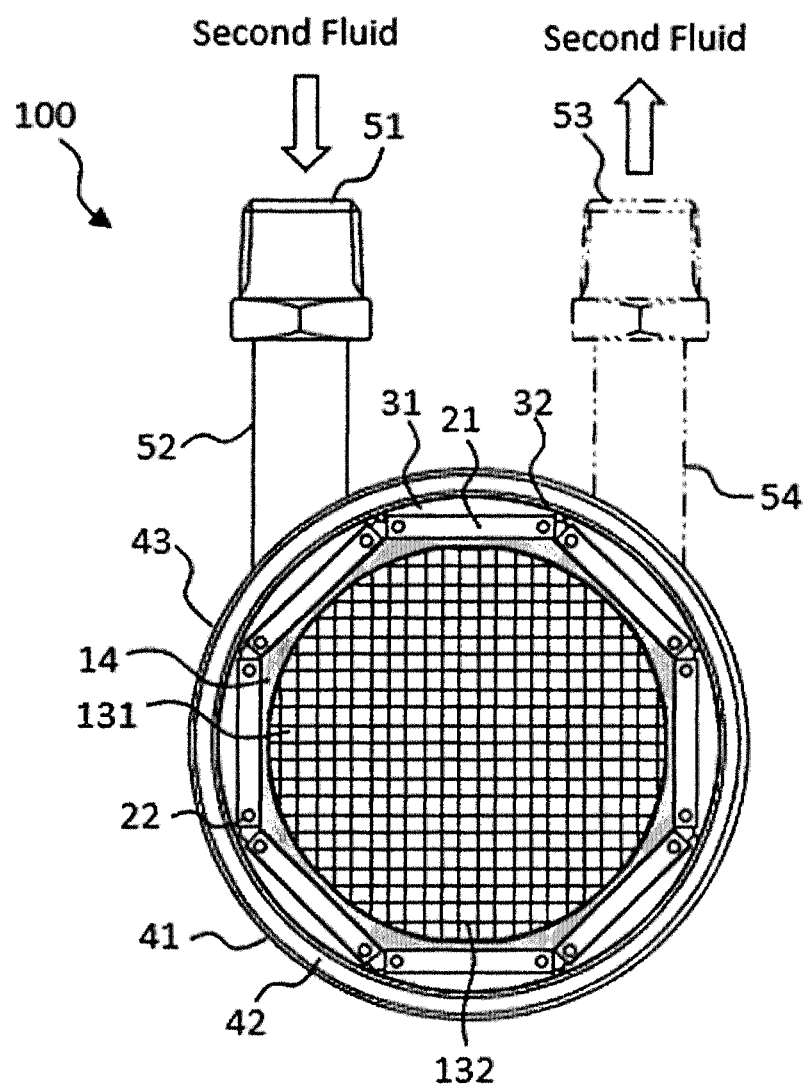

[FIG. 2-1]
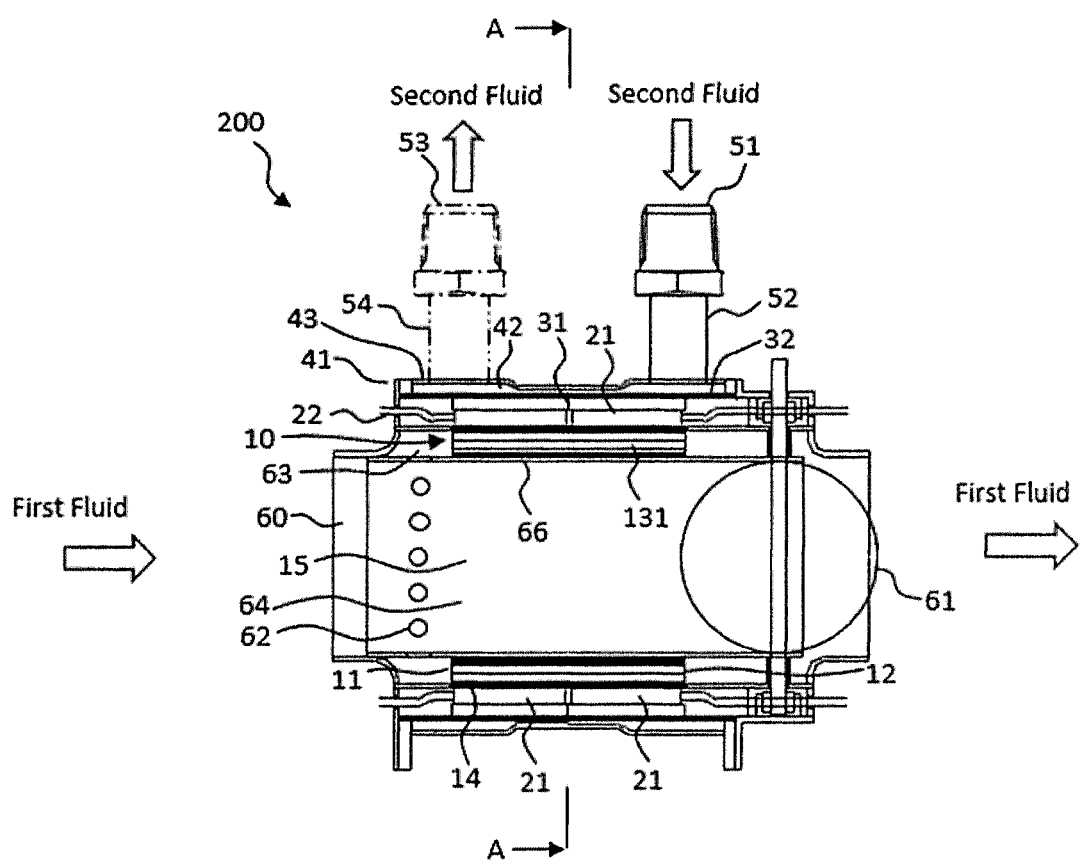

[FIG. 2-2]
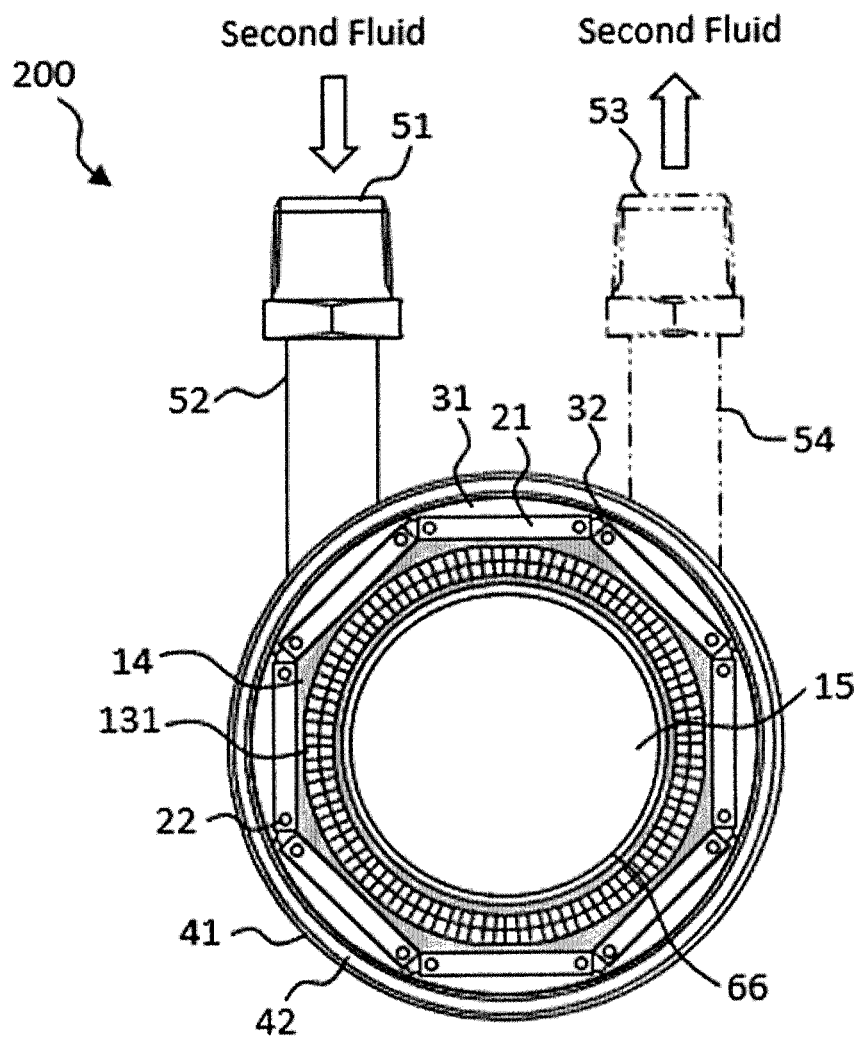

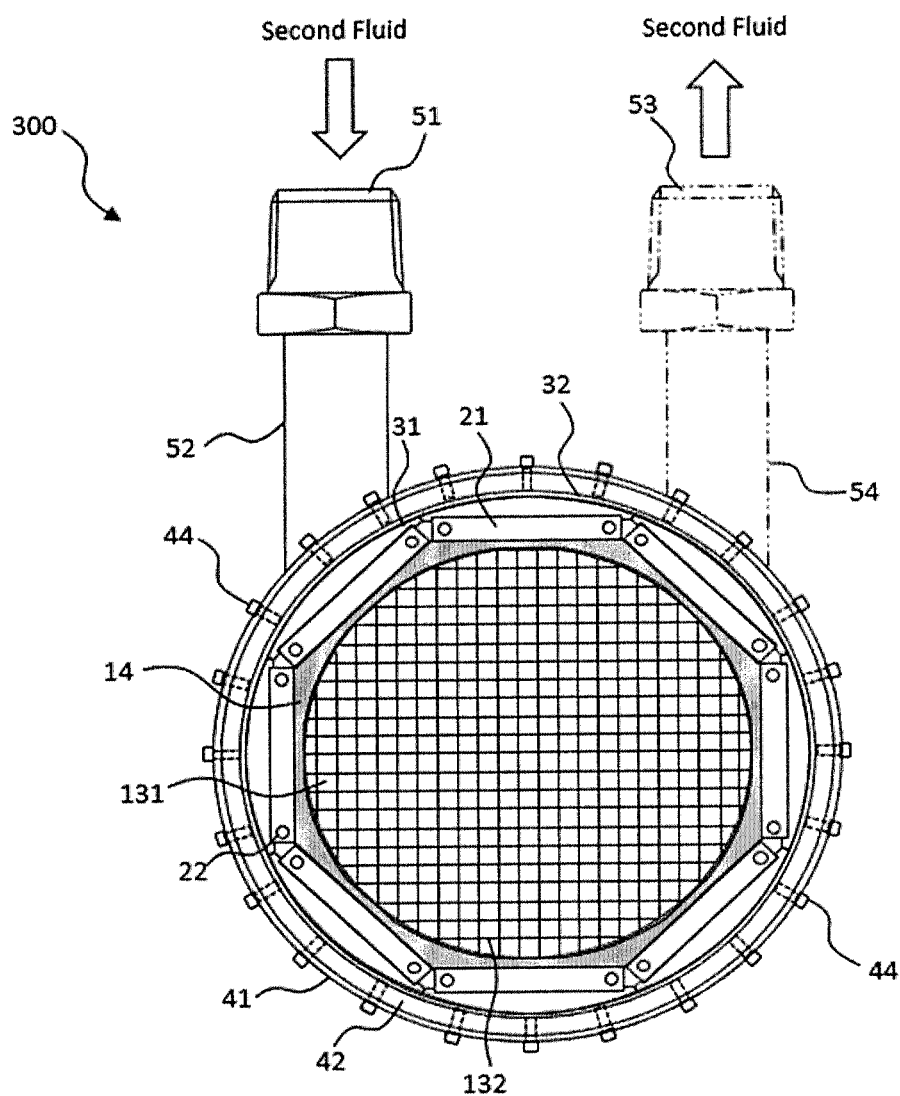
[FIG. 3-1]

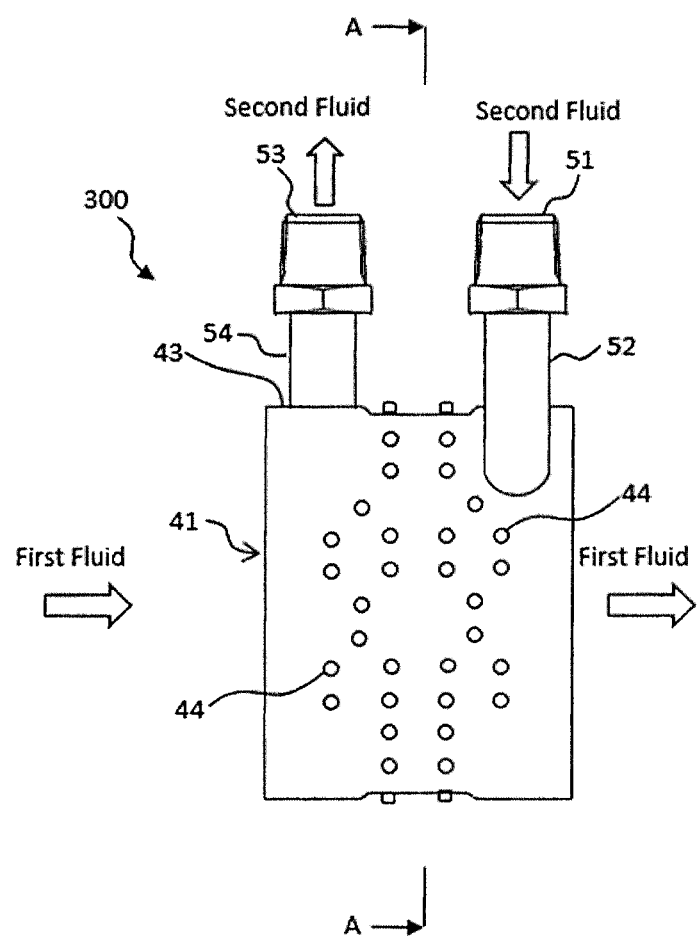
[FIG. 3-2]

[FIG. 3-3]
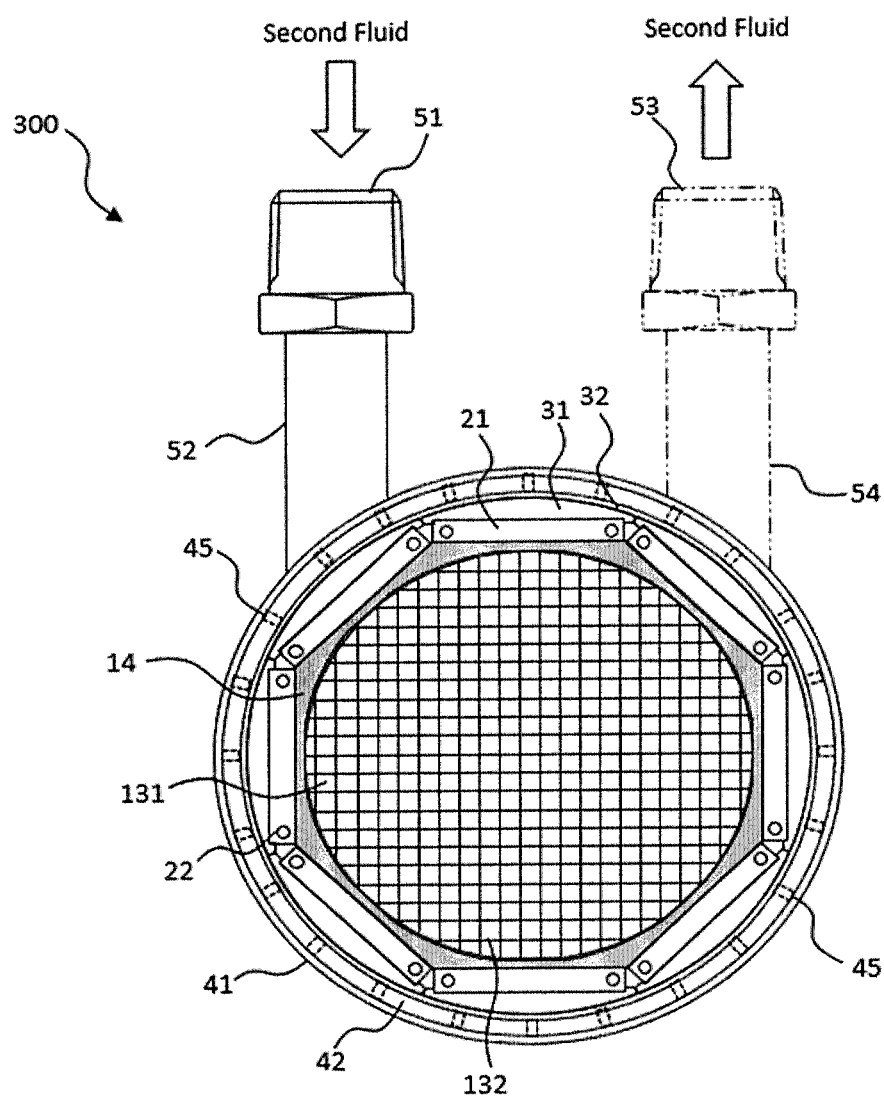

[FIG. 3-4]
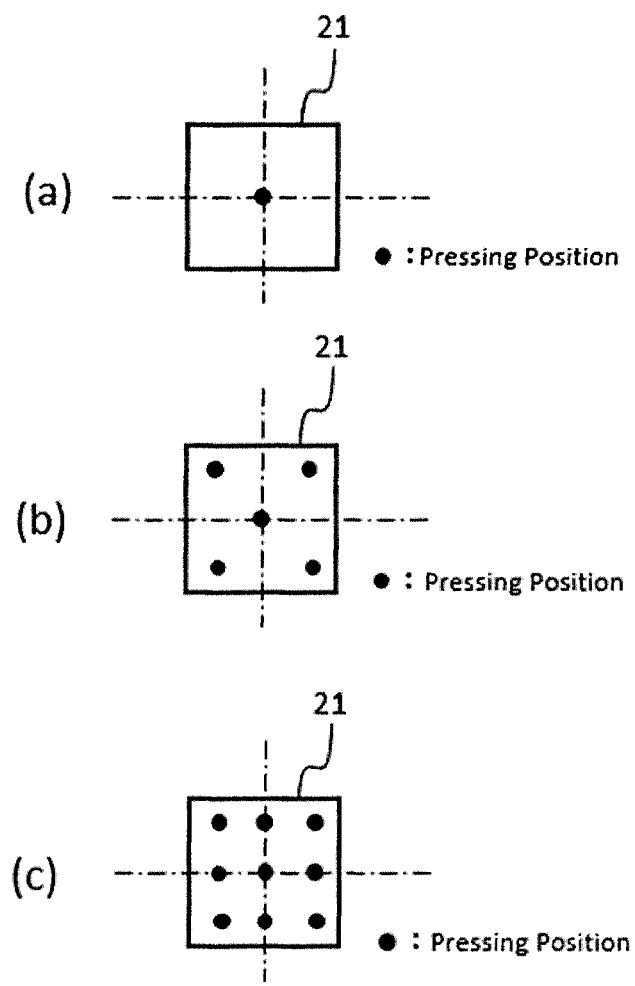

[FIG. 4-1]
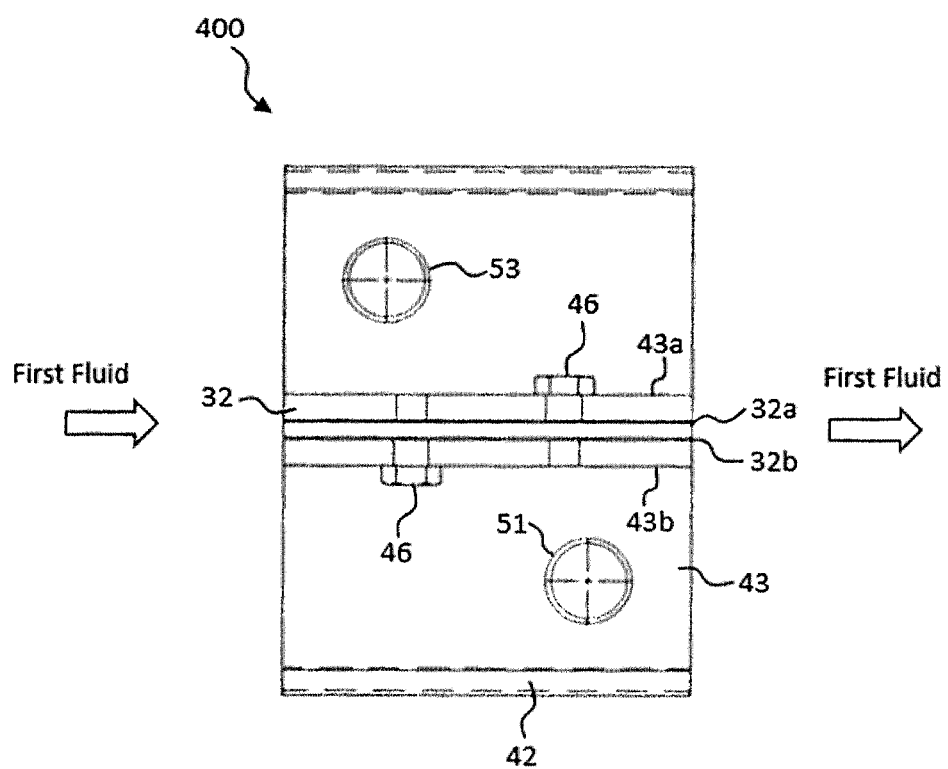

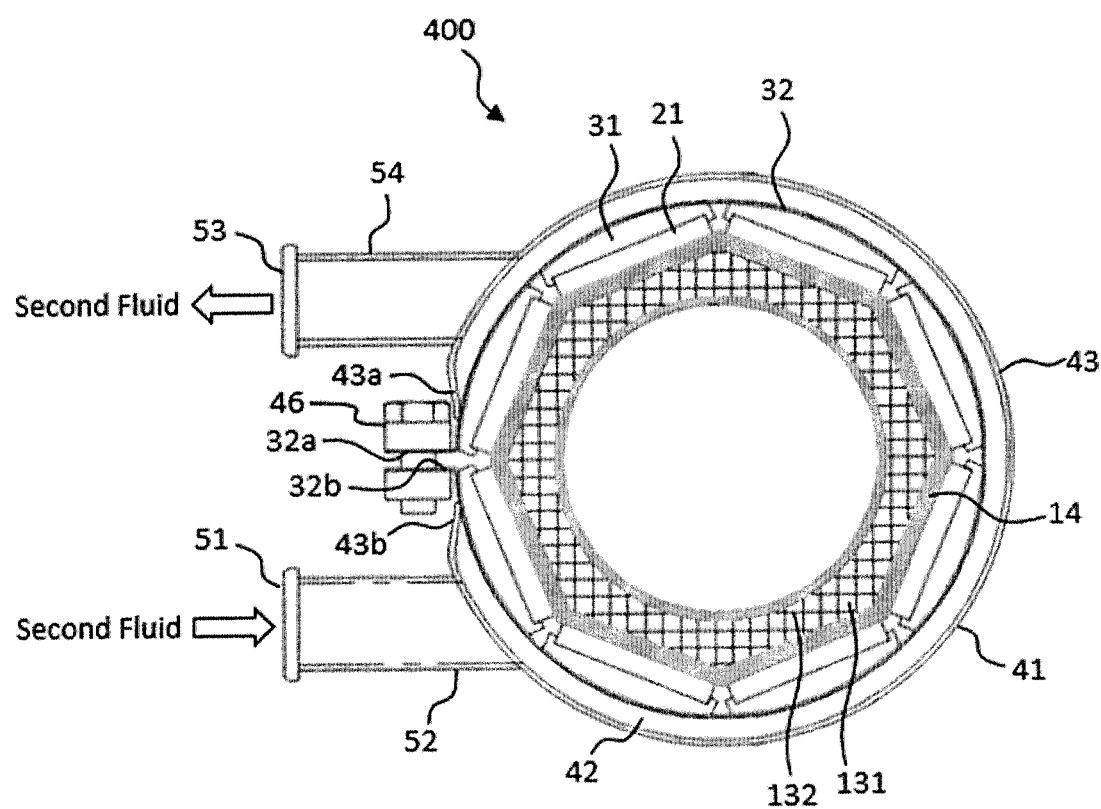
[FIG. 4-2]

[FIG. 5-1]
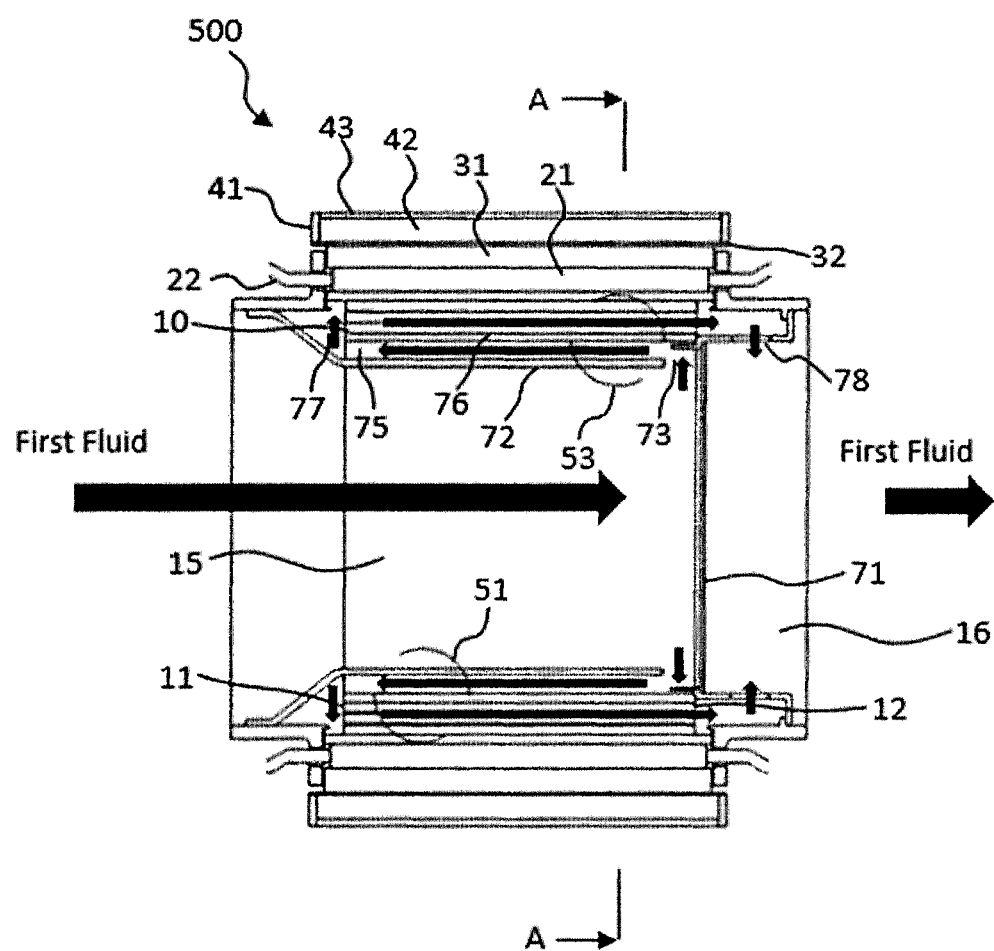

[FIG. 5-2]
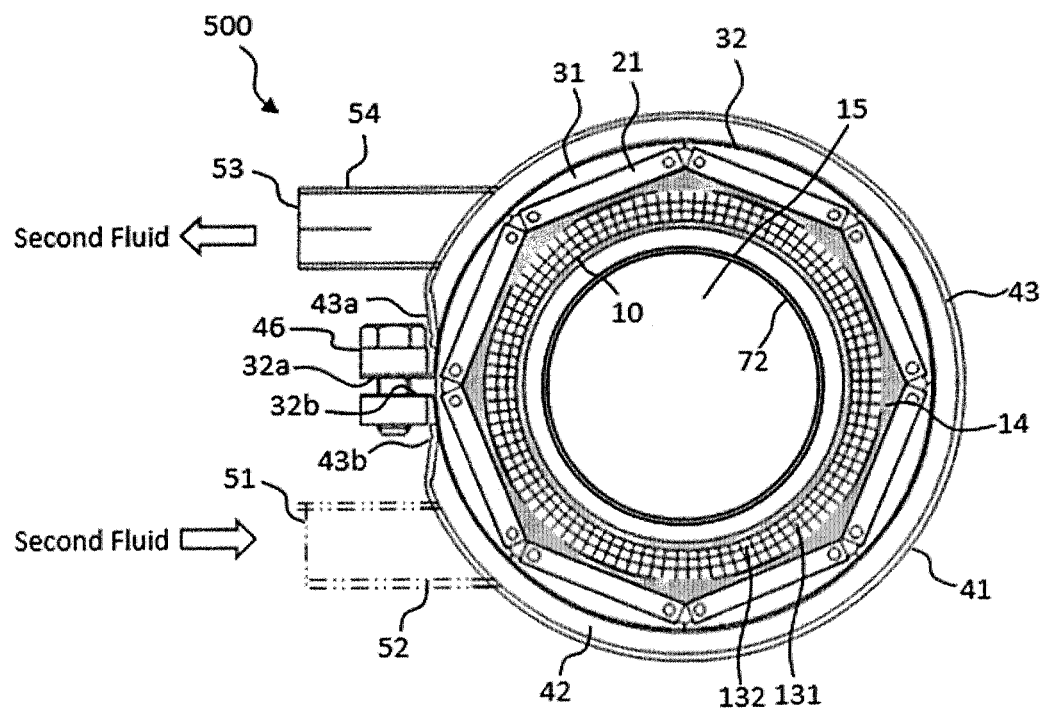

[FIG. 6-1]
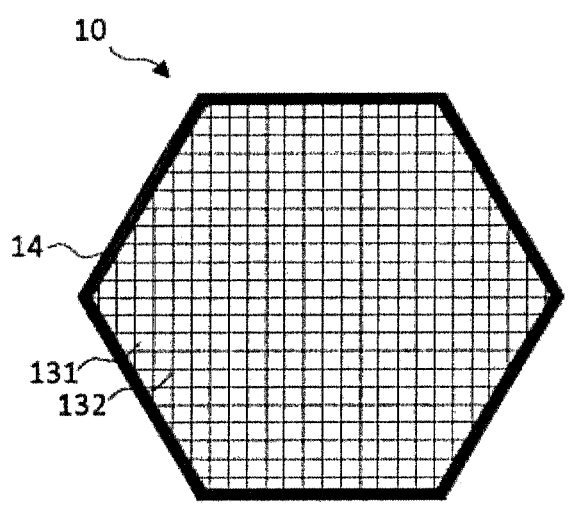

[FIG. 6-2]
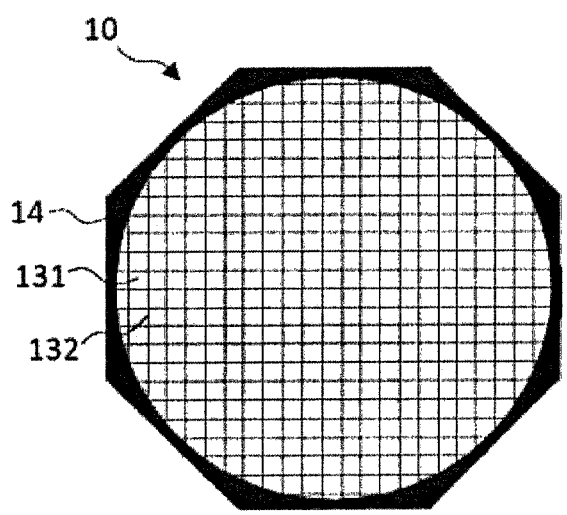

[FIG. 6-3]
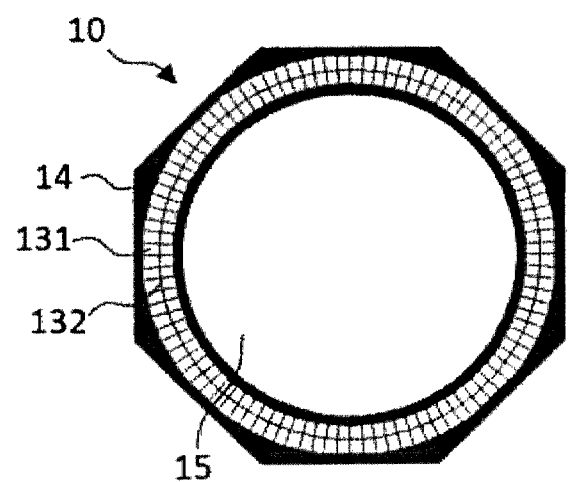

[FIG. 7]
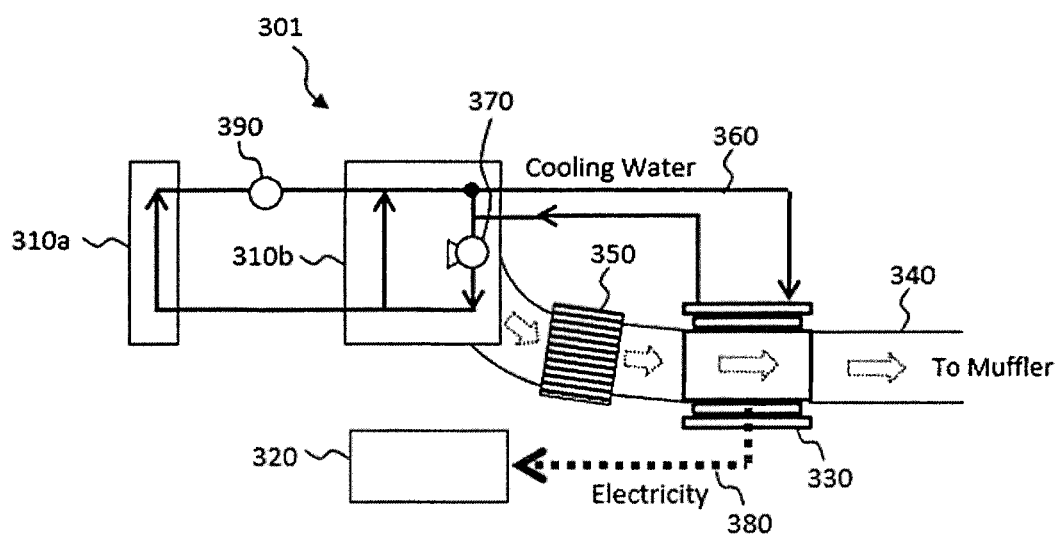

HEAT RECOVERY DEVICE AND HEAT RECOVERY SYSTEM WITH A THERMOELECTRIC MODULE

FIELD OF THE INVENTION

The present invention relates to a heat recovery device and a heat recovery system. More particularly, the present invention relates to a heat recovery device and a heat recovery system, which are disposed in an exhaust line of a combustion engine or a combustion device.

BACKGROUND OF THE INVENTION

Recently, there has been a need for improvement of fuel economy of motor vehicles. Particularly, there has been a need for a system that can reduce friction loss by promptly warming up a cooling water, an engine oil, ATF (Automatic Transmission Fluid) or like in order to prevent deterioration of fuel economy when the engine is cold, such as when the engine is started. Further, there has been a need for a system that heats a catalyst in order to promptly activate an exhaust purifying catalyst.

An example of such a system is a heat exchanger. The heat exchanger is a device comprising a component (a heat exchange component) that performs heat exchange by allowing a first fluid to internally flow and a second fluid to externally flow. In such a heat exchanger, heat can be effectively utilized by heat exchange from a higher temperature fluid (for example, the exhaust gas) to a lower temperature fluid (for example, the cooling water).

For example, Patent Document 1 discloses a heat exchange member that aims to improve a fuel efficiency of a motor vehicle by recovering exhaust heat from an exhaust gas in the motor vehicle field. Patent Document 1 discloses a heat exchanger including: a first fluid flowing portion formed by a honeycomb structure having a plurality of cells, the cells being defined by ceramic partition walls and piercing in an axial direction from one end face to the other end face, wherein a heated fluid as a first fluid flows through the cells; and a second fluid flowing portion formed by a casing containing the honeycomb structure therein, wherein an inlet and an outlet for a second fluid are formed in the casing, and wherein the second fluid flowing portion is for receiving heat from the first fluid by allowing a second fluid to flow on an outer peripheral surface of the honeycomb structure.

It is also known that there is a technique to improve a fuel efficiency by converting thermal energy contained in an exhaust gas from a motor vehicle into electric energy and recovering it, and effectively using it as electric power for charging a battery or driving an electrical component.

For example, Patent Document 2 discloses an exhaust heat recovery device for recovering heat of gas, which includes a thermoelectric conversion element that generates power by thermoelectric conversion using the heat of the gas released from a heat source. The exhaust heat recovery device includes: a fixing member having a fluid pipe through which the gas released from the heat source flows and which forms a gas flow path having a circumferential cross section, the fixing member fixing the thermoelectric conversion element to the fluid pipe; and a pressing member for pressing the thermoelectric conversion element in a direction of the fluid pipe, wherein the pressing member is configured such that a pressing force pressing the thermoelectric conversion element against the fluid pipe decreases as a temperature of the gas flowing through the gas flow path increases. Non-Patent Document 1 also discloses the same type of exhaust heat recovery device.

CITATION LIST

Patent Literatures

Patent Document 1: WO 2011/071161 A1
Patent Document 2: Japanese Patent Application Publication No. 2005-210782 A

Non-Patent Literature

Non-Patent Document 1: K. M. SAQR, M. K. MANSOUR and M. N. MUSA, "THERMAL DESIGN OF AUTOMOBILE EXHAUST BASED THERMOELECTRIC GENERATORS: OBJECTIVES AND CHALLENGES", International Journal of Automotive Technology, Vol. 9, No. 2, pp. 155-160 (2008)

SUMMARY OF THE INVENTION

The heat exchanger disclosed in Patent Document 1 has only a heat exchange function, so that there is still room for improvement in terms of effectively using exhaust heat. Further, although Patent Document 2 and Non-Patent Document 1 each discloses the exhaust heat recovery device that converts exhaust heat from a motor vehicle exhaust gas into electrical energy using the thermoelectric conversion element, its structure is complicated such as the flow path for cooling water being provided for each conversion element, which causes an increase of manufacturing costs.

Patent Document 2 also discloses that the thermoelectric conversion element is configured such that the pressing force of the thermoelectric conversion element against the fluid pipe is reduced in order to prevent the thermoelectric conversion element from being damaged when the exhaust temperature is too high. However, with the pressing force using thermal expansion, no significant change can be expected in the surface pressure, and it is doubtful whether the damage prevention effect can be obtained. Patent Document 2 also discloses that air is introduced from a compressor to an expansion/contraction member to control the pressing force applied to the thermoelectric conversion element by the pressing member. However, the structure of the device becomes complicated, and production costs and operation costs are also increased.

The present invention has been created in view of the above issues. One of the objects of the present invention is to provide a simple heat recovery device having an excellent ability to use exhaust heat effectively.

In order to solve the above issues, the present inventors have invented the following heat recovery devices and heat recovery systems:

In one aspect, the present invention relates to a heat recovery device, comprising:
  a pillar-shaped honeycomb structure comprising:
    an outer peripheral side wall having one or more planar outer peripheral side surfaces; and
    a plurality of partition walls disposed on an inner side of the outer peripheral side wall, the partition walls defining a plurality of cells, the cells piercing from a first end face to a second end face to form a flow path for a first fluid;
  one or more thermoelectric conversion modules arranged to face the one or more planar outer peripheral side surfaces;

a tubular member that circumferentially covers the outer peripheral side surfaces of the honeycomb structure and the one or more thermoelectric conversion modules; and a casing that circumferentially covers the tubular member;

wherein the partition walls are mainly configured of ceramics; and wherein the casing has an inflow port and an outflow port for a second fluid having a temperature lower than that of the first fluid, and a flow path for the second fluid is formed circumferentially around the tubular member, between an inner surface of the casing and an outer surface of the tubular member.

In one embodiment, the heat recovery device according to the present invention comprises a heat transfer member disposed between the one or more thermoelectric conversion modules and the tubular member.

In another embodiment of the heat recovery device according to the present invention, an inner peripheral side surface of the tubular member is fitted to an outer peripheral side surface of the heat transfer member.

In still another embodiment of the heat recovery device according to the present invention, an entire outer peripheral side surface of the heat transfer member forms a cylindrical surface as a whole.

In still another embodiment, the heat recovery device according to the present invention comprises a substance interposed between the one or more thermoelectric conversion modules and the heat transfer member, the substance reducing contact thermal resistance between both.

In still another embodiment, the heat recovery device according to the present invention comprises a substance interposed between the one or more thermoelectric conversion modules and the outer peripheral side surface of the outer peripheral side wall, the substance reducing contact thermal resistance between both.

In still another embodiment of the heat recovery device according to the present invention, the honeycomb structure comprises a hollow portion that pierces from a central portion of the first end face to a central portion of the second end face to form a flow path for the first fluid, and the honeycomb structure has the cells on an outer peripheral side of the hollow portion.

In still another embodiment, the heat recovery device according to the present invention comprises a branch path for branching a route for the first fluid passing through the honeycomb structure into a route passing through the hollow portion and a route passing through the cells.

In still another embodiment, the heat recovery device according to the present invention comprises a mechanism capable of adjusting a flow rate ratio of the first fluid passing through the hollow portion and the first fluid passing through the cells.

In still another embodiment, the heat recovery device according to the present invention comprises:

a guide tube extending from an upstream side of an inlet of the hollow portion to a vicinity of an outlet of the hollow portion;

a baffle plate disposed in the vicinity of the outlet of the hollow portion;

a first introduction port for guiding the first fluid to an outer peripheral side of the guide tube, the first introduction port being provided in the vicinity of the outlet of the hollow portion on an upstream side of the baffle plate;

a returning flow path formed between an inner peripheral wall of the honeycomb structure and an outer surface of the guide tube, the returning flow path being in communication with the first introduction port; and a second introduction port for communicating the returning flow path to inlets of the cells on the first end face side.

In still another embodiment of the heat recovery device according to the present invention, the first fluid is an exhaust gas from a combustion engine or a combustion device.

In still another embodiment of the heat recovery device according to the present invention, the first fluid is an exhaust gas from a motor vehicle engine.

In still another embodiment of the heat recovery device according to the present invention, the second fluid is cooling water that circulates between the engine and the heat recovery device.

In still another embodiment of the heat recovery device according to the present invention, the tubular member is pressed by one or more screws inserted from an outer peripheral side of the casing, or by one or more springs interposed between the casing and the tubular member.

In still another embodiment of the heat recovery device according to the present invention, the tubular member is formed by winding a strip member around the outer peripheral side surface of the honeycomb structure and the one or more thermoelectric conversion modules.

In another aspect, the present invention relates to a heat recovery system, comprising:

a one-way route for a first fluid;

a circulation route for a second fluid having a temperature lower than that of the first fluid;

the heat recovery device according to the present invention, disposed in the route for the first fluid and the route for the second fluid; and a battery for storing electricity generated by the heat recovery device.

In one embodiment, the heat recovery system according to the present invention further comprises at least one device for receiving heat from the second fluid flowing out from the outflow port for the second fluid of the heat recovery device, the device for receiving heat being disposed in the route for the second fluid.

In another embodiment of the heat recovery system according to the present invention, the device for receiving heat from the second fluid is a radiator.

In still another embodiment of the heat recovery system according to the present invention, the second fluid is cooling water for an engine and the device for receiving heat from the second fluid is an engine.

In still another embodiment of the heat recovery system according to the present invention, the route for the first fluid is an exhaust path from the engine, and an exhaust purification device using a catalyst is disposed in the exhaust path and on an upstream side of the heat recovery device.

The heat recovery device according to the present invention has a thermoelectric conversion function in addition to a heat exchange function, and has an excellent ability to effectively use exhaust heat. Also, the heat recovery device according to the present invention has a simple structure and is thus easily produced, which can contribute to reduction in production costs. Therefore, for example, disposing of the heat recovery device according to the present invention in an exhaust line of a motor vehicle facilitates effective utilization of exhaust heat, so that environmental performance of the motor vehicle can be improved.

BRIEF DESCRIPTION OF THE DRAWINGS

FIG. 1-1 is a view for explaining a cross-sectional structure parallel to an axial direction (a cell extending direction) of a heat recovery device according to a first embodiment of the present invention.

FIG. 1-2 is a view for explaining a cross-sectional structure orthogonal to an axial direction (a cell extending direction) of a heat recovery device according to a first embodiment of the present invention.

FIG. 2-1 is a view for explaining a cross-sectional structure parallel to an axial direction (a cell extending direction) of a heat recovery device according to a second embodiment of the present invention.

FIG. 2-2 is a view for explaining a cross-sectional structure orthogonal to an axial direction (a cell extending direction) of a heat recovery device according to a second embodiment of the present invention.

FIG. 3-1 is a view for explaining arrangement of screws when a heat recovery device according to a third embodiment of the present invention is observed from a direction orthogonal to an axial direction (a cell extending direction).

FIG. 3-2 is a view for explaining arrangement of screws when a heat recovery device according to a third embodiment of the present invention is observed from a direction parallel to an axial direction (a cell extending direction).

FIG. 3-3 is a schematic view of a heat recovery device according to a third embodiment of the present invention as observed from a direction orthogonal to an axial direction (a cell extending direction) when springs are used in place of screws.

FIG. 3-4 schematically shows a relationship between a thermoelectric conversion module and a pressing point.

FIG. 4-1 is a view for explaining a structure of a heat recovery device according to a fourth embodiment of the present invention when observed from a direction parallel to an axial direction (a cell extending direction).

FIG. 4-2 is a view for explaining a structure of a heat recovery device according to a fourth embodiment of the present invention when observed from a direction orthogonal to an axial direction (a cell extending direction).

FIG. 5-1 is a view for explaining a cross-sectional structure parallel to an axial direction (a cell extending direction) of a heat recovery device according to a fifth embodiment of the present invention.

FIG. 5-2 is a view for explaining a cross-sectional structure orthogonal to an axial direction (a cell extending direction) of a heat recovery device according to a fifth embodiment of the present invention.

FIG. 6-1 is a view for explaining a cross-sectional structural example orthogonal to an axial direction (a cell extending direction) of a honeycomb structure.

FIG. 6-2 is a view for explaining another cross-sectional structural example orthogonal to an axial direction (a cell extending direction) of a honeycomb structure.

FIG. 6-3 is a view for explaining still another cross-sectional structural example orthogonal to an axial direction (a cell extending direction) of a honeycomb structure.

FIG. 7 shows an arrangement example of a heat recovery system according to the present invention.

DETAILED DESCRIPTION OF THE INVENTION

Hereinafter, embodiments of the present invention will be specifically described with reference to the drawings. It should be understood that the present invention is not limited to the following embodiments, and changes, improvements, and the like added to the following embodiments as appropriate without departing from the spirit of the present invention based on ordinary knowledge of those skilled in the art will fall within the scope of the present invention.

<1 Heat Recovery Device>

FIG. 1-1 shows a cross-sectional structure parallel to an axial direction (a cell extending direction) of a pillar-shaped honeycomb structure of a heat recovery device (100) according to a first embodiment of the present invention. FIG. 1-2 shows a cross-sectional structure (the A-A line cross section) of the heat recovery device (100) according to the first embodiment of the present invention when viewed from a direction orthogonal to the axial direction (the cell extending direction) of the pillar-shaped honeycomb structure.

FIG. 2-1 shows a cross-sectional structure parallel to an axial direction (a cell extending direction) of a pillar-shaped honeycomb structure of a heat recovery device (200) according to a second embodiment of the present invention. FIG. 2-2 shows a cross sectional structure (the line A-A cross section) of the heat recovery device (200) according to the second embodiment of the present invention when viewed from a direction orthogonal to the axial direction (the cell extending direction) of the pillar-shaped honeycomb structure.

It should be noted that the two-dot chain lines in the figures are imaginary lines of an inflow port (51) and an inlet conduit (52) for a second fluid.

Each of the heat recovery device (100) according to the first embodiment and the heat recovery device (200) according to the second embodiment comprises a pillar-shaped honeycomb structure (10) including: an outer peripheral side wall (14) having one or more planar outer peripheral side surfaces; and a plurality of partition walls (132) disposed on an inner side of the outer peripheral side wall (14), the partition walls (132) being mainly configured of ceramics and defining a plurality of cells (131), each cell (131) piercing from a first end face (11) to a second end face (12) to form a flow path for a first fluid.

Further, each of the heat recovery device (100) according to the first embodiment and the heat recovery device (200) according to the second embodiment includes: one or more thermoelectric conversion modules (21) disposed to face the outer peripheral side surface of the honeycomb structure (10).

Furthermore, each of the heat recovery device (100) according to the first embodiment and the heat recovery device (200) according to the second embodiment comprises a tubular member (32) for circumferentially covering the outer peripheral side surface of the honeycomb structure (10) and the one or more thermoelectric conversion modules (21).

Moreover, each of the heat recovery device (100) according to the first embodiment and the heat recovery device (200) according to the second embodiment includes a casing (41) for circumferentially covering the tubular member (32).

(1-1 Honeycomb Structure)

The honeycomb structure (10) is pillar-shaped, and includes the outer peripheral side wall (14) having one or more planar outer peripheral side surfaces, and the partition walls (132) disposed on the inner side of the outer peripheral side wall (14), in which the partition walls (132) are mainly configured of ceramics, and define the cells (131) that pierce from the first end face (11) to the second end face (12) to form the flow paths for the first fluid. Because of such arrangement, heat of the first fluid passing through the cells (131) of the honeycomb structure (10) can be efficiently collected and transmitted to the outside. The first fluid flows from the first end face (11) toward the second end face (12), i.e., in the direction of the arrows in FIGS. 1-1 and 2-1 (the direction from the left side to the right side of the page), and in the direction from the front to the back of the page in FIGS. 1-2 and 2-2. The first fluid is not particularly limited, and various liquids and gases can be used. For example, when the heat recovery device is disposed in an exhaust line of a combustion engine or a combustion device, it can be an exhaust gas. In particular, when the heat recovery device is disposed in an exhaust line of a motor vehicle, the first fluid can be an exhaust gas from the engine.

The outer peripheral side wall (14) of the honeycomb structure (10) has one or more planar outer peripheral side surfaces. The thermoelectric conversion module (21) is often flat. Therefore, the honeycomb structure (10) has the planar outer peripheral side surface, whereby the thermoelectric conversion modules (21) can be easily disposed in face-to-face attachment. Improvement of heat transfer efficiency can be expected by the face-to-face attachment. In terms of capable of disposing a large number of thermoelectric conversion modules (21), the outer peripheral side wall of the honeycomb structure (10) preferably has a plurality of planar outer peripheral side surfaces, and preferably three or more planar outer peripheral side surfaces. The honeycomb structure (10) preferably has a polygonal pillar shape in terms of manufacturability and heat recovery efficiency. In this case, all of the three or more outer peripheral side surfaces of the outer peripheral side wall (14) are flat.

In order to increase an utilization efficiency of heat from the honeycomb structure (10), it is preferable one of the main surfaces (high temperature side surface) of the thermoelectric conversion module (21) be entirely in direct or indirect contact with the outer peripheral side surface of the outer peripheral side wall (14). When the one of the main surfaces (high temperature side surface) of the thermoelectric conversion module (21) is entirely in indirect contact with the outer peripheral side surface of the outer peripheral side wall (14), the one of the main surface (high temperature side surface) of the thermoelectric conversion module is preferably contacted via a substance for reducing contact thermal resistance between both, the substance being disposed on the outer peripheral side surface of the outer peripheral side wall.

Examples of polygonal pillar include, but are not limited to, triangular, quadrangular, pentagonal, hexagonal, heptagonal, octagonal, or other polygonal pillars. It is preferable that the outer peripheral side surfaces opposing to each other are parallel, and that the number of outer peripheral side surfaces be an even number (square, hexagon, octagon, and so on) for easy assembly. The polygonal pillar is typically a right-angled pillar. In order to easily provide a uniform contact state (pressing pressure or the like) of each thermoelectric conversion module with respect to each outer peripheral side surface, the contour of the polygonal pillar is preferably symmetrical, and preferably, the outer shape of the honeycomb structure (10) is a right-angled pillar shape with regular polygonal end faces. In the first embodiment and the second embodiment, the outer shape of the honeycomb structure is a regular octagonal pillar shape.

The outer peripheral side surface of the outer peripheral side wall (14) is determined depending on the outer shape of the honeycomb structure (10). When the outer shape of the honeycomb structure (10) is a polygonal pillar shape, the outer peripheral side surface of the outer peripheral side wall (14) becomes a polygon when the cross section is observed from the direction orthogonal to the cell extending direction. On the other hand, the shape of the inner peripheral side surface of the outer peripheral side wall (14) is not particularly limited. In one embodiment, the inner peripheral side surface of the outer peripheral side wall (14) can have a polygonal shape corresponding to the outer peripheral side surface of the outer peripheral side wall (14) when the cross section is observed from the direction orthogonal to the cell extending direction. In FIG. 6-1, when the cross section of the honeycomb structure (10) is observed from the direction orthogonal to the cell extending direction, the outer peripheral side surface of the outer peripheral side wall (14) is regular hexagonal shaped, and the inner peripheral side surface of the outer peripheral side wall (14) is also regular hexagonal shaped. In another embodiment, the shape of the inner peripheral side surface of the outer peripheral side wall (14) may not correspond to the outer peripheral side surface of the outer peripheral side wall. In FIGS. 6-2 and 6-3, when the cross section of the honeycomb structure (10) orthogonal to the cell extending direction is observed, the outer peripheral side surface of the outer peripheral side wall (14) is regular octagonal shaped, while the inner peripheral side surface of the side wall (14) is circular.

In one embodiment, when the cross section of the honeycomb structure (10) orthogonal to the cell extending direction is observed, the entire region located on an inner side of the inner peripheral side surface of the outer peripheral side wall (14) may be comprised of the cells (131) (e.g., FIGS. 6-1 and 6-2). According to such an embodiment, the number of partition walls for heat transfer increases, enabling an efficiency of recovering heat from the first fluid to be improved.

In another embodiment, when the cross section of the honeycomb structure (10) orthogonal to the cell extending direction is observed, the honeycomb structure (10) has a hollow portion (15) that pierces from the central portion of the first end face (11) to the central portion of the second end face (12) to form a flow path for the first fluid, and the cells (131) may be arranged on the outer peripheral side of the hollow portion (15) (e.g., FIG. 6-3). The size (cross-sectional area) of the hollow portion (15) can be determined depending on an expected temperature of the first fluid, in view of the fact that a heat recovery efficiency from the first fluid passing through the hollow portion (15) is lower than a heat recovery efficiency from the first fluid passing through the cells (131).

Further, the heat recovery device may be configured such that a flow rate ratio of the first fluid passing through the hollow portion and the first fluid passing through the cells can be changed. For example, when the temperature of the first fluid is too high or the flow rate is increased, resulting in large pressure loss due to the above configuration, the flow rate ratio of the first fluid passing through the hollow portion can be increased to reduce an amount of heat transferred to the thermoelectric conversion modules, in order to prevent any damage to the thermoelectric conversion modules. The heat recovery device may be configured such that the flow rate of the first fluid passing through the cells may be zero, and the flow rate ratio may be changed so that the first fluid passes only through the hollow portion. Conversely, when a flow rate of the first fluid is low and it is desired that the heat recovery should be facilitated, the flow rate ratio of the first fluid passing through the cells can be increased, resulting in an increased amount of heat transferred to the thermoelectric conversion modules. The heat recovery device may be configured such that the flow rate of the first fluid passing through the hollow portion may be zero, and the flow rate ratio may be changed so that the first fluid passes only through the cells.

For example, the heat recovery device (200) according to the second embodiment includes a branch path (62) branching a route (60) for the first fluid flowing in the honeycomb structure (10) into a route (64) passing through the hollow portion (15) and a route (63) passing through the cells (131). In the heat recovery device (200) according to the second embodiment as shown in FIG. 2-1, the branch path (62) is formed by a plurality of through holes disposed in a pipe forming the route (60) for the first fluid. The heat recovery device (200) according the second embodiment has a mechanism that can adjust the flow rate ratio of the first fluid passing through the hollow portion (15) and the first fluid passing through the cells (131).

The adjustment mechanism of the flow rate ratio is not particularly limited, but it includes a method of disposing a flow rate control valve (61) on an upstream side of the first end face (11) or a downstream side of the second end face (12) of the honeycomb structure (10), in one or both of the route (64) passing through the hollow portion (15) and the route (63) passing through the cells (131). The flow rate control valve (61) can have any known structure, including, for example, a gate valve, a butterfly valve, a ball valve and the like. The flow rate control valve (61) may be manually opened and closed, but it may be automatically opened and closed by a pneumatic or electric actuator or the like. Also, it may be opened and closed by using an actuator (a thermoactuator, a thermostat, etc.) using a volume change of a material (wax or the like) depending on the temperature. In the heat recovery device (200) according to the second embodiment as shown in FIG. 2-1, a butterfly valve (61) is disposed on the downstream side of the second end face (12) in the route (64) passing through the hollow portion (15).

In order to prevent the first fluid flowing through the hollow portion (15) and the first fluid flowing through the cells (131) from coming and going to each other, an airtight wall (66) can be disposed such that both can be separated from each other. For example, this can allow reduction of an amount of heat transferred from the first fluid flowing through the hollow portion (15) to the thermoelectric conversion modules (21) via the cells (131).

The first fluid flowing out of the hollow portion (15) and the cells (131) may be joined downstream of the second end face (12) of the honeycomb structure (10). The joined first fluid is discharged from the same discharge port.

The shapes of the cells in the cross section orthogonal to the axial direction (the cell extending direction) of the honeycomb structure are not particularly limited. A desired shape may be appropriately selected from a circle, an ellipse, a triangle, a square, a hexagon, and other polygons, and the like. In the embodiment shown in FIGS. 6-1 and 6-2, the cross-sectional shape of the cell (131) is square-shaped. In the embodiment as shown in FIG. 6-3, each cell (131) has a shape surrounded by an arc-shaped partition wall on the inner peripheral side, an arc-shaped partition wall on the outer peripheral side, and two partition walls extending in the radial direction.

The partition walls of the honeycomb structure is mainly configured of ceramics. The "mainly configured of ceramics" means that a mass ratio of ceramics in the total mass of the partition walls is 50% by mass or more.

The porosity of the partition walls may be preferably 10% or less, and more preferably 5% or less, and particularly preferably 3% or less. The porosity of the partition walls may also be 0%. The porosity of the partition walls of 10% or less can improve thermal conductivity.

The partition walls may preferably contain SiC (silicon carbide) having high thermal conductivity as a main component. The "contain SiC (silicon carbide) as a main component" means that a mass ratio of SiC (silicon carbide) in the total mass of the partition walls is 50% by mass or more.

More particularly, materials of the honeycomb structure that can be used include Si-impregnated SiC, (Si+Al)-impregnated SiC, metal composite SiC, recrystallized SiC, $Si_3N_4$, SiC, and the like.

There is no particular limitation for cell density (i.e., the number of cells per unit area) in the cross section orthogonal to the axial direction (the cell extending direction) of the honeycomb structure. The cell density may be designed as needed, but may be preferably in a range of 4 to 320 cells/$cm^2$. The cell density of 4 cells/$cm^2$ or more can lead to sufficient strength of the partition walls, and hence sufficient strength and effective GSA (geometric surface area) of the honeycomb structure itself. Further, the cell density of 320 cells/$cm^2$ or less can prevent an increase in pressure loss when the first fluid flows.

The honeycomb structure may preferably have an isostatic strength of 1 MPa or more, and more preferably 5 MPa or more. If the isostatic strength of the honeycomb structure is 1 MPa or more, the honeycomb structure can have sufficient durability. The upper limit value of the isostatic strength of the honeycomb structure may be about 100 MPa. The isostatic strength of the honeycomb structure can be measured according to the method for measuring the isostatic fracture strength defined in the JASO standard M505-87, which is the motor vehicle standard issued by Society of Automotive Engineers of Japan, Inc.

The diameter of the honeycomb structure in the cross section orthogonal to the cell extending direction may be preferably from 20 to 200 mm, and more preferably from 30 to 100 mm. Such a diameter can improve heat recovery efficiency. As used herein, the diameter of the maximum inscribed circle that is inscribed in the outer peripheral side surface of the honeycomb structure as observed in the cross section orthogonal to the cell extending direction is defined as the diameter of the honeycomb structure in the cross section orthogonal to the cell extending direction.

The thickness of the partition walls of the cells of the honeycomb structure may be appropriately designed according to a purpose, and is not particularly limited. The thickness of the partition walls may be preferably from 0.1 to 1 mm, and more preferably from 0.2 to 0.6 mm. The thickness of the partition walls of 0.1 mm or more can lead to sufficient mechanical strength and prevent breakage due to impact or thermal stress. Further, the thickness of the partition wall of 1 mm or less can prevent problems such as an increase in pressure loss of the first fluid and a decrease in heat recovery efficiency when the heat medium permeates.

The partition walls may preferably have a density of from 0.5 to 5 g/$cm^3$. The density of the partition walls of 0.5 g/$cm^3$ or more can lead to sufficient strength of the partition walls and prevent the partition walls from being damaged by resistance generated when the first fluid passes through the inside of the flow path (inside of the cells). Further, the density of the partition walls of 5 g/$cm^3$ or less can reduce the weight of the honeycomb structure. The density within the above range can lead to a strengthened honeycomb structure and also produce an effect of improving thermal conductivity. The density of the partition walls is a value measured by the Archimedes method.

The honeycomb structure may preferably have a thermal conductivity of 50 W/(m·K) or more, and more preferably from 100 to 300 W/(m·K), and more preferably from 120 to 300 W/(m·K), at 25° C. The thermal conductivity of the honeycomb structure within such a range can lead to good thermal conductive properties and efficiently transfer heat in the honeycomb structure to the thermoelectric conversion modules. The value of thermal conductivity is measured by the laser flash method (JIS R1611-1997).

When an exhaust gas from an engine flows as the first fluid through the cells of the honeycomb structure, a catalyst may preferably be supported on the partition walls of the honeycomb structure. The supporting of the catalyst on the partition walls can allow conversion of CO, NOx, HC and the like in the exhaust gas to harmless substances by the catalytic reaction, and additionally allow reaction heat generated by the catalytic reaction to be used for heat exchange. The catalyst may preferably include at least one element selected from the group consisting of noble metals (platinum, rhodium, palladium, ruthenium, indium, silver and gold), aluminum, nickel, zirconium, titanium, cerium, cobalt, manganese, zinc, copper, tin, iron, niobium, magnesium, lanthanum, samarium, bismuth, and barium. The at least one element as listed above may be contained as a metal simple substance, a metal oxide, and other metal compound.

An amount of the catalyst (catalyst metal+support) to be supported may be preferably from 10 to 400 g/L. Further, for the catalyst containing the noble metal, the amount of the catalyst to be supported may be preferably from 0.1 to 5 g/L. If the amount of the catalyst (catalyst metal+support) to be supported is 10 g/L or more, the catalysis will tend to occur. On the other hand, if the amount of the catalyst to be supported is 400 g/L or less, pressure loss can be suppressed and an increase in a manufacturing cost can be thus suppressed. The support refers to a carrier on which the catalytic metal is supported. The support may preferably include at least one selected from the group consisting of alumina, ceria and zirconia.

(1-2 Thermoelectric Conversion Module)

One or more thermoelectric conversion modules (21) are arranged to face one or more planar outer peripheral side surfaces of the outer peripheral side wall (14) of the honeycomb structure (10). In order to improve the heat utilization efficiency, one or more thermoelectric conversion modules (21) may be arranged to face all the outer peripheral side surfaces of the outer peripheral side wall (14). The thermoelectric conversion module (21) can convert heat to electricity by the Seebeck effect when there is a temperature difference between both ends. In the present invention, the thermoelectric conversion modules (21) are operated to convert the heat energy to the electrical energy using the temperature difference between the first fluid with a higher temperature and the second fluid with a lower temperature. The electricity generated in the thermoelectric conversion modules (21) can be supplied to various electronic devices via, for example, electric wires (22), or stored in a battery.

In the thermoelectric conversion module (21), for example, a heat receiving substrate made of insulating ceramics and a heat dissipation substrate made of insulating ceramics are disposed at both ends, between which an N-type thermoelectric conversion element and a P-type thermoelectric conversion element alternately connected in series via an electrode are disposed. The thermoelectric conversion modules adjacent to each other may be electrically connected via wiring. Typically, the heat receiving substrate is disposed at the end of the thermoelectric conversion module (21) closer to the first fluid, and the heat dissipation substrate is disposed at the end of the thermoelectric conversion module (21) closer to the second fluid.

The shape of the thermoelectric conversion module (21) is not particularly limited, but a flat thermoelectric conversion module is preferred in terms of easy availability from the market and of making heat recovery device compact.

The flat thermoelectric conversion modules (21) can be easily arranged to face one or more planar outer peripheral side surfaces of the outer peripheral side wall (14) of the honeycomb structure (10).

(1-3 Tubular Member)

A tubular member (32) circumferentially cover the outer peripheral side surface of the honeycomb structure (10) and the one or more thermoelectric conversion modules (21). The tubular member (32) has an effect of retaining the shape so as not to collapse the structure in which one or more thermoelectric conversion modules (21) are arranged to face the outer peripheral side surface of the outer peripheral side wall (14), and an effect of preventing the first fluid and the second fluid from being mixed together. In order to enhance the effect of retaining the shape, the inner peripheral side surface of the tubular member (32) is directly or indirectly fitted to the outer peripheral portion of the thermoelectric conversion module (21). The "fitted" as used herein means that they are fixed in a state where they are engaged with each other. Therefore, the term "fitted" includes cases where they are fixed to each other by fitting such as clearance fitting, tight fitting and shrinkage fitting, as well as by brazing, welding, diffusion bonding and the like.

It is preferable to have a higher ratio of the area of a portion of the outer peripheral side surface of the outer peripheral side wall (14), which portion is circumferentially covered with the tubular member (32), to the total area of the outer peripheral side surface of the outer peripheral side wall (14), in terms of increasing heat recovery efficiency. More particularly, such an area ratio may be preferably 80% or more, and more preferably 90% or more, and more preferably 100% (i.e., the entire outer peripheral side surface of the outer peripheral side wall (14) is circumferentially covered with the tubular member (32)). The term "outer peripheral side surface" as used herein refers to a surface parallel to the axial direction (the cell extending direction) of the honeycomb structure, and does not include a surface orthogonal to the axial direction (the cell extending direction) of the honeycomb structure.

The material that can form the tubular member (32) is not particularly limited as long as it produces the above effects, but it is preferably a material having good thermal conductivity, including, for example, metals, ceramics and the like. Among them, metals may be preferred in terms of manufacturability (ease of assembling). Metals that can be used include stainless steel, titanium alloys, copper alloys, aluminum alloys, brass and the like, for example. Among them, the stainless steel may be preferred for the reason of its high durability and reliability.

The tubular member (32) may preferably have a thickness of 0.1 mm or more, and more preferably 0.3 mm or more, and still more preferably 0.5 mm or more, in terms of duration reliability. The thickness of the tubular member (32) may be preferably 10 mm or less, and more preferably 5 mm or less, and still more preferably 3 mm or less, in terms of reducing thermal resistance.

(1-4 Casing)

A casing (41) is arranged so as to circumferentially cover the tubular member (32). The casing (41) has an inflow port (51) and an outflow port (53) for the second fluid having a temperature lower than that of the first fluid. Between an inner surface of the casing (41) and an outer surface of the tubular member (32), a flow path (42) for the second fluid is formed so as to circumferentially cover the tubular member (32). The casing (41) preferably has an outer tubular member (43) that circumferentially covers the entire tubular member (32). The flow path (42) for the second fluid is not provided individually for each heat transfer conversion module, but is provided only to circumferentially cover the tubular member (32). Thus, the flow path (42) for the second fluid can be easily constructed.

The casing (41) includes: the inflow port (51) for the second fluid; an inlet conduit (52) for connecting the inflow port (51) and the outer tubular member (43); the outflow port (53) for the second fluid; and an outlet conduit (54) for connecting the outflow port (53) and the outer tubular member (43). The second fluid flows from the inflow port (51) into the casing (41). The second fluid then undergoes heat exchange with the first fluid while passing through the flow path (42), and then flows out from the outflow port (53). With this configuration, heat can be recovered from the first fluid by the heat transfer conversion modules, as well as heat can be recovered from the first fluid by heat exchange. The inflow port (51) for the second fluid is preferably disposed on a side close to the second end face (12), and the outflow port (53) for the second fluid is preferably disposed on a side close to the first end face (11). This can allow the second fluid to flow in the opposite direction (countercurrent) to the first fluid, so that the heat recovery performance tends to be stably exhibited.

In order to prevent the second fluid from leaking to the outside, the outer peripheral side surface at both ends of the tubular member (32) in the axial direction (cell extending direction) preferably each has a structure in which the outer peripheral side surface is circumferentially in close contact with the inner side surface of the casing (41). The method of bringing the outer peripheral side surface of the tubular member (32) into close contact with the inner surface of the casing (41) includes, but not particularly limited to, welding, diffusion joining, brazing, and the like. Among these, the welding is preferable because of high duration reliability.

The material of the casing (41) includes, but not particularly limited to, desirably materials having good thermal conductivity, for example, metals, ceramics and the like. Among them, metals may be preferable in terms of manufacturability (ease of assembling). Metals that can be used include, for example, stainless steel, titanium alloys, copper alloys, aluminum alloys, brass and the like. Among them, stainless steel may be preferred because of its higher duration reliability.

The casing (41) may preferably have a thickness of 0.1 mm or more, and more preferably 0.5 mm or more, and even more preferably 1 mm or more, in terms of duration reliability. The thickness of the casing (41) may be preferably 10 mm or less, and more preferably 5 mm or less, and still more preferably 3 mm or less, in terms of cost, volume and weight.

When the heat recovery device is used for recovering exhaust heat from an exhaust gas of an engine or the like, the casing may be structured such that both ends of the casing in the direction parallel to the axial direction (cell extending direction) of the honeycomb structure can be connected to the piping through which the exhaust gas of the engine passes. When an inner diameter of the piping through which the exhaust gas passes is different from the inner diameters of both end portions of the casing, a gas introduction pipe in which the inner diameter of the piping gradually increases or decreases may be provided between the piping and the casing, or the piping may be directly connected to the casing.

The second fluid is not particularly limited. When the heat recovery device serves as a heat exchanger mounted on a motor vehicle, the second fluid is preferably water or an antifreeze liquid (LLC as defined in JIS K 2234: 2006). As the second fluid, an engine oil, ATF, or refrigerant fluorocarbon may also be used.

(1-5 Heat Transfer Member)

A heat transfer member (31) can be disposed between the one or more thermoelectric conversion modules (21) and the tubular member (32). The disposing of the heat transfer member (31) can provide an effect of increasing a heat recovery efficiency and an effect of enhancing the effect of retaining the shape by the tubular member (32). The heat transfer member (31) is preferably configured to fill a gap as much as possible between the one or more thermoelectric conversion modules (21) and the tubular member (32). Moreover, the inner peripheral side surface of the tubular member (32) is preferably fitted to the outer peripheral side surface of the heat transfer member (31), in terms of increasing the heat recovery efficiency and enhancing the effect of retaining the shape.

For example, the heat transfer member (31) can have such an inner peripheral shape that matches the outer peripheral side shape of one or more thermoelectric conversion modules (21), and also have such an outer peripheral shape that matches the inner peripheral side shape of the tubular member (31). In the embodiment as shown in FIGS. 1-2 and 2-2, the outer peripheral side surface of the heat transfer member (31) forms a cylindrical surface as a whole, and fitted to the inner peripheral side surface of the tubular member (32) having a cylindrical shape.

The material of the heat transfer member (31) includes, but not particularly limited to, materials having good thermal conductivity, for example, metals, ceramics and the like. Among them, metals may be preferred in terms of manufacturability (ease of assembling). Examples of the metals include stainless steel, titanium alloys, copper alloys, aluminum alloys, brass and the like. Among them, the aluminum alloys may be preferable because of good processability and good thermal conductivity.

(1-6 Substances for Reducing Contact Thermal Resistance)

Between the one or more thermoelectric conversion modules (21) and the heat transfer member (31), a substance for reducing contact thermal resistance between both may be interposed. Similarly, between the one or more thermoelectric conversion modules (21) and the outer peripheral side surface of the outer peripheral side wall (14), the substance for reducing the contact thermal resistance between both may be interposed. The interposing of the substance for reducing the contact thermal resistance can increase the heat recovery efficiency. Examples of the substance for reducing the contact thermal resistance include metal sheets, carbon (graphite) sheets, thermal sheets, and thermal greases. Specific examples of the metal include soft metals such as aluminum, copper and lead, and alloys such as solder.

(2 Method of Producing Heat Recovery Device)

Next, a method for producing the heat recovery device according to the present invention will be exemplarily described.

(2-1 Production of Honeycomb Structure)

First, a green body containing ceramics powder is extruded into a desired shape to produce a honeycomb formed body. As a material for the honeycomb formed body, the above-mentioned ceramics can be used. For example, when producing a honeycomb formed body containing a Si-impregnated SiC composite material as a main component, a binder and water or an organic solvent are added to a predetermined amount of SiC powder, and the resultant mixture is kneaded to form a green body, which is then formed to obtain a honeycomb formed body having a desired shape. The resulting honeycomb formed body can then be dried, impregnated with metallic Si and fired in an inert gas under a reduced pressure or in a vacuum, to obtain a honeycomb structure having a plurality of cells partitioned by partition walls.

(2-2 Arrangement of Thermoelectric Conversion Module)

A desired number of thermoelectric conversion modules are then disposed on each outer peripheral side surface of the honeycomb structure. After arranging the heat transfer member on the outer peripheral side of each thermoelectric conversion module as needed, the resulting assembly is inserted into the tubular member. Shrinkage-fitting in this state can allow the inner peripheral side surface of the tubular member to be fitted to the outer peripheral side surface of the assembly (e.g., the outer peripheral side surface of the heat transfer member).

In such a way, a core component including the honeycomb structure, thermoelectric conversion modules and tubular member, and preferably further including the heat transfer member, is completed. By structuring the core component so as not to be disassembled unless a force is applied from the outside, handling of the heat recovery device becomes easy.

(2-3 Attachment of Casing)

The casing having the components as stated above is formed by a method such as die molding, bending, or cutting, and the casing is joined to the core component so as to circumferentially cover the tubular member of the core component. Typically, the core component can be inserted into the outer tubular member of the casing, and both can be joined by a method such as welding and brazing.

Such a procedure can lead to production of the heat recovery device in which the core component and the casing are combined. However, the method for producing the heat recovery device according to the present invention is not limited to the production methods as described above.

(2-4 Third Embodiment)

In order to improve the output of one or more thermoelectric conversion modules (21), one or more thermoelectric conversion modules (21) are preferably in close contact with the outer peripheral side wall (14) of the honeycomb structure (10). FIGS. 3-1 and 3-2 illustrate configuration of a heat recovery device (300) according to the third embodiment according to the present invention, which is effective for achieving such an object. In FIGS. 3-1 and 3-2, elements denoted by the same reference numerals as those of FIGS. 1-1, 1-2, 2-1 and 2-2 indicate the same elements, and so descriptions thereof will be omitted.

In the heat recovery device (300) according to the third embodiment, as shown in FIG. 3-1, each screw (44) is inserted from the outer peripheral side of the casing (41) toward the inner tubular member (32), and the tubular member (32) is pressed by the tip of each screw (44). As the tubular member (32) is pressed, the one or more thermoelectric conversion modules (21) located on the inner peripheral side of the tubular member (32) are also pressed, so that the thermoelectric conversion modules (21) are easily brought into close contact with the honeycomb structure (10).

FIG. 3-4 schematically shows a relationship between the thermoelectric conversion module (21) and pressing points. Each screw (44) is preferably inserted at a position where the center of gravity of each thermoelectric conversion module (21) can be pressed, as shown in FIG. 3-4 (a). Also, as shown in FIGS. 3-4 (b) and (c), each thermoelectric conversion module (21) is more preferably pressed by a plurality of screws, and the screws are arranged in a line-symmetric or point-symmetric manner. The number of screws for pressing each thermoelectric conversion module (21) is preferably 5 or more, and more preferably 9 or more.

The tubular member (32) may be pressed by one or more of springs (45) interposed between the casing (41) and the tubular member (32), instead of the screw (44). In this case, the preferred spring arrangement is similar to that of the screw. FIG. 3-3 shows a schematic view of the heat recovery device according to the third embodiment of the present invention when observed from the direction orthogonal to the axial direction (cell extending direction) when springs are used instead of the screws.

(2-5 Fourth Embodiment)

FIGS. 4-1 and 4-2 each shows a structure of the heat recovery device (400) according a fourth embodiment of the present invention, which is effective for bringing the one or more thermoelectric conversion modules (21) into close contact with the outer peripheral side wall (14) of the honeycomb structure (10). In FIGS. 4-1 and 4-2, elements denoted by the same reference numerals as those of FIGS. 1-1, 1-2, 2-1 and 2-2 indicate the same elements, and so descriptions thereof will be omitted.

The heat recovery device (400) according to the fourth embodiment has a tubular member (32) formed by winding a strip member around the outer peripheral side surface of the honeycomb structure (10) and the one or more thermoelectric conversion modules (21), and preferably the heat transfer member (31). A pair of opposing edges (32a, 32b) of the tubular member (32) are fastened using one or more fasteners (46) while applying a tensile force in a direction where the distance between both becomes closer. The one or more thermoelectric conversion modules (21) located on an inner side of the tubular member (32) are tightened inward by the pressure from the tubular member (32), so that the one or more thermoelectric conversion modules (21) are easily brought into close contact with the outer peripheral side wall (14) of the honeycomb structure (10).

The pair of opposing edges (32a, 32b) of the tubular member (32) can be formed along the axial direction of the honeycomb structure (10). The fastener (46) is not particularly limited as long as the fastener (46) has a structure that exhibits the above functions. It may be structured by, for example, a bolt and a nut.

In the heat recovery device (400) according to the fourth embodiment, the outer tubular member (43) of the casing (41) includes: one end edge (43a) joined to the outer surface of the tubular member (32) along the one edge (32a) of the tubular member (32); and the other end edge (43b) joined to the outer surface of the tubular member (32) along the other end edge (32b) of the tubular member (32). Both end edges (43a, 43b) of the outer tubular member (43) can be formed along the axial direction of the honeycomb structure (10). The method of joining end edges (43a, 43b) of the outer tubular member (43) to the tubular member (43) is not particularly limited, but welding is preferable in terms of preventing leakage of the second fluid flowing through the interior of the casing (41).

In the heat recovery device (400) according to the fourth embodiment, both end edges (43a, 43b) of the outer tubular member (43) are not joined to each other. Therefore, when the heat recovery device (100) according to the fourth embodiment is observed from a direction orthogonal to the axial direction (cell extending direction), the outer tubular member (43) appears to be C-shaped.

(2-6 Fifth Embodiment)

FIGS. 5-1 and 5-2 each shows a structure of a heat recovery device (500) according to the fifth embodiment of the present invention. In FIGS. 5-1 and 5-2, elements denoted by the same reference numerals as those of FIGS. 1-1, 1-2, FIGS. 2-1 and 2-2 indicate the same elements, and so descriptions thereof will be omitted.

In the heat recovery device (500) according to the fifth embodiment, the honeycomb structure (10) includes the hollow portion (15) that pierces from the central portion of the first end surface (11) to the central portion of the second end face (12) to form the flow path for the first fluid, and a plurality of cells (131) are disposed on the outer peripheral side of the hollow portion (15), when observed in the cross section from a direction orthogonal to the cell extending direction (FIG. 5-2).

The heat recovery device (500) according to the fifth embodiment includes:

a guide pipe (72) extending from an upstream side of an inlet of the hollow portion (15) to a vicinity of an outlet of the hollow portion (15);

a baffle plate (71) disposed in the vicinity of the outlet of the hollow portion (15);

a first introduction port (73) for guiding the first fluid to an outer peripheral side of the guide tube (72), the first introduction port (73) being provided in the vicinity of the outlet of the hollow portion (15) on an upstream side of the baffle plate (71);

a returning flow path (75) formed between an inner peripheral wall (76) of the honeycomb structure (10) and an outer surface of the guide tube (72), the returning flow path (75) being in communication with the first introduction port (73); and a second introduction port (77) for communicating the returning flow path (75) to inlets of the cells (131) on the first end face (11) side.

The vicinity of the outlet of the hollow portion (15) refers to a downstream side of the center of the honeycomb structure (10) in the axial direction. The most downstream end of the guide pipe (72) is preferably present in a region of 0 to 40% and more preferably present in a region of 0 to 20% from the second end face (12) relative to the total axial length of the honeycomb structure (10). The baffle plate (71) is preferably disposed on a downstream side of the most downstream end of the guide pipe (72) and in a region of 0 to 40%, more preferably in a region of 0 to 20%, from the second end face (12) relative to the total axial length of the honeycomb structure (10).

The flow of the first fluid in the heat recovery device (500) according to the fifth embodiment will be described. The first fluid is guided by the guide tube (72) to flow into the hollow portion (15). The flow direction of the first fluid is changed by the baffle plate (71) disposed in the vicinity of the outlet of the hollow portion (15) to flow into the first introduction port (73). The first fluid then flows through the returning flow path (75) from the second end face (12) side of the honeycomb structure (10) toward the first end face (11) side. Since the first fluid flowing through the returning flow path (75) is adjacent to the inner peripheral wall (76) of the honeycomb structure (10), heat transfer occurs from the first fluid to the honeycomb structure (10).

In the heat recovery devices (100, 200) according to the first embodiment and the second embodiment as described above, the temperature of the first fluid flowing through the honeycomb structure (10) tends to decrease from the first end face (11) toward the second end face (12). Therefore, electric power generation amount tends to decrease as it approaches the second end face (12). However, in the heat recovery device (500) according to the fifth embodiment, heat transfer occurs while the first fluid flows through the returning flow path (75) from the second end face (12) side toward the first end face (11) side, so that the second end face (12) side of the honeycomb structure (10) can be easily heated. This can result in a uniform temperature of the honeycomb structure (10) in the axial direction, so that the entire heat exchange efficiency of the honeycomb structure (10) can be improved.

The first fluid flows through the returning flow path (75), and then passes through the second introduction port (77) to flow into the inlets of the cells (131) on the first end face (11) side of the honeycomb structure (10). The first fluid flowing out from the outlets on the second end face (12) side of the cells (131) can be discharged via a discharge port (78) into an outlet space (16) provided on the downstream side of the baffle plate (71) and isolated from the hollow portion (15).

<3 Heat Recovery System>

FIG. 7 shows a configuration example of a heat recovery system according to the present invention.

A heat recovery system (301) according to this embodiment includes:

a one-way route (340) for a first fluid;

a circulation route (360) for a second fluid having a temperature lower than that of the first fluid;

the heat recovery device (330) according to the present invention, disposed in the route (340) for the first fluid and the route (360) for the second fluid; and a battery (320) for storing electricity generated by the heat recovery device (330).

The first fluid (e.g., an exhaust gas of a motor vehicle) flows from a first fluid source (e.g., an engine) into the inlet for the first fluid of the heat recovery device (330) while passing through the one-way route (e.g., exhaust line) (340). When the one-way route (340) for the first fluid is an exhaust path from the engine, an exhaust purification device (350) using a catalyst is preferably disposed in the exhaust path and on an upstream side of the heat recovery device (330). Although the exhaust purification device (350) using the catalyst may be disposed on a downstream side of the heat recovery device (330), an exhaust gas having a decreased temperature flows into the exhaust purification device (350), causing a risk that the catalyst performance is not sufficiently exhibited, which is not preferable.

The second fluid (for example, cooling water) having a temperature lower than that of the first fluid flows into the inflow port for the second fluid of the heat recovery device (330) while passing through the circulation route (360). The second fluid can be circulated through the circulation route (360) by a pump (370) disposed in the circulation route (360). When the heat recovery device according to the present invention is disposed in a motor vehicle, a cooling water pump installed in the engine may be used as the pump (370).

Within the heat recovery device (330), the thermoelectric conversion modules generate power using the temperature difference between the first fluid and the second fluid. The generated electricity is stored in the battery (320) via an electric wire (380). Within the heat recovery device (330), the second fluid that has received heat from the first fluid by heat exchange flows out from the outlet for the second fluid of the heat recovery device (330) to flow through the circulation route (360). It is more preferable that the heat the second fluid has received be recovered by a device for receiving heat (310*a*, 310*b*), in terms of improving a heat recovery rate. When the device for receiving heat (310*a*, 310*b*) is provided, the second fluid is again returned to the heat recovery device (330) through the circulation route (360) after being cooled by the devices for receiving heat (310a, 310b) from the second fluid. The first fluid flowing out from the outlet for the first fluid of the heat recovery device (330) passes through the one-way route and is sent to the next step. For example, when the first fluid is an exhaust gas from a motor vehicle, the first fluid is released to the atmosphere after reducing the exhaust sound by a muffler.

The devices for receiving heat from the second fluid include, but not particularly limited to, a radiator and an engine. In particular, a case where the second fluid is engine cooling water and the device for receiving heat from the second fluid is an engine and a radiator will be described below with reference to FIG. 7. In general, the circulation route is formed such that the cooling water is circulated between an engine (310b) and a radiator (310a). A thermostat (390) is installed in the circulation route. When the engine (310b) is cold and the temperature of cooling water is low, such as the time of starting, the thermostat is closed and the cooling water is circulated within the engine (310b) (more precisely, a water jacket provided in the engine) for warming up the engine. When the temperature of the cooling water reaches an elevated temperature up to a predetermined valve opening temperature, the thermostat (390) is opened, and the cooling water starts to be circulated between the engine (310b) and the radiator (310a).

The situation where thermostat is closed at the time of starting of the engine means that the engine is cold and requires warming-up. According to the embodiment as shown in FIG. 7, the circulation route for the second fluid includes a route in which a part of the second fluid (cooling water) circulating in the engine (310b) is branched and taken out, passes through the heat recovery device (330) and then returns to the engine (310b) again. This can allow the use of the heat recovered by the heat recovery device (330) to warm up the engine. That is, in this situation, the engine (310b) will be the device for receiving heat from the second fluid. Therefore, according to the heat recovery system according to the present embodiment, at the time of starting of the engine, power can be generated by thermoelectric conversion, and the heat recovered by the second fluid can be used for warming up the engine (310b), further contributing to improvement of fuel economy.

On the other hand, in a situation where the temperature of the engine (310b) is increased and the cooling water (second fluid) is circulated between the radiator (310a) and the engine (310b), the heat recovered by the second fluid cannot be used for warming up the engine (310b). However, according to the embodiment as shown in FIG. 7, the circulation route for the second fluid includes a route in which the second fluid flowing out from the heat recovery device (330) passes through the radiator (310a) and then returns back to the heat recovery device (330) again. As a result, the heat recovered by the second fluid in the heat recovery device (330) is taken away by the radiator (310a) to cool the second fluid, and the heat can be then utilized for thermoelectric conversion by the heat recovery device (330) again. That is, in this situation, the radiator (310a) is the device for receiving heat from the second fluid.

DESCRIPTION OF REFERENCE NUMERALS 10 honeycomb structure
11 first end face
12 second end face
14 outer peripheral side wall
15 hollow portion
16 outlet space
21 thermoelectric conversion module
22 electric wire
31 heat transfer member
32 tubular member
32a one end edge of tubular member
32b the other edge of tubular member
38 electric wire
41 casing
42 flow path for second fluid
43 outer tubular member
43a one end edge of outer tubular member
43b the other end edge of outer tubular member
44 screw
45 spring
46 fastener
51 inflow port for second fluid
52 inlet conduit for second fluid
53 outflow port for second fluid
54 outlet conduit for second fluid
60 route for first fluid
61 flow rate control valve (butterfly valve)
62 branch path
63 route passing through cells
64 route passing through hollow portion
66 wall
71 baffle plate
72 guide pipe
73 first introduction port
75 returning flow path
76 inner peripheral wall
77 second introduction port
78 outflow port
100 heat recovery device
131 cell
132 partition wall
200 heat recovery device
300 heat recovery device
301 heat recovery system
310a device for receiving heat from second fluid (radiator)
310b device for receiving heat from second fluid (engine)
320 battery
330 heat recovery device
340 one-way route for first fluid
360 circulation route for second fluid
370 pump
380 electric wire
390 thermostat
400 heat recovery device
500 heat recovery device

What is claimed is:
1. A heat recovery device, comprising:
a pillar-shaped honeycomb structure comprising:
an outer peripheral side wall having one or more planar outer peripheral side surfaces; and
a plurality of partition walls disposed on an inner side of the outer peripheral side wall, the partition walls defining a plurality of cells, the cells piercing from a first end face to a second end face to form a flow path for a first fluid;
one or more flat-shaped thermoelectric conversion modules arranged to face the one or more planar outer peripheral side surfaces;
a cylindrical-shaped tubular member that circumferentially covers the outer peripheral side surfaces of the honeycomb structure and the one or more thermoelectric conversion modules; and a casing that circumferentially covers the tubular member;
wherein the partition walls are mainly configured of ceramics;
wherein the casing has an inflow port and an outflow port for a second fluid having a temperature lower than that of the first fluid, and a flow path for the second fluid is formed circumferentially around the tubular member between an inner surface of the casing and an outer surface of the tubular member; and
wherein the tubular member is pressed by a plurality of screws inserted from an outer peripheral side of the casing, or by a plurality of springs interposed between the casing and the tubular member, such that each thermoelectric conversion module is pressed by more than one of the plurality of screws or the plurality of springs.

2. The heat recovery device according to claim 1, wherein the heat recovery device comprises a heat transfer member disposed between the one or more thermoelectric conversion modules and the tubular member.

3. The heat recovery device according to claim 2, wherein an inner peripheral side surface of the tubular member is fitted to an outer peripheral side surface of the heat transfer member.

4. The heat recovery device according to claim 3, wherein an entire outer peripheral side surface of the heat transfer member forms a cylindrical surface as a whole.

5. The heat recovery device according to claim 2, wherein the heat recovery device comprises a substance interposed between the one or more thermoelectric conversion modules and the heat transfer member, the substance reducing contact thermal resistance between both.

6. The heat recovery device according to claim 1, wherein the heat recovery device comprises a substance interposed between the one or more thermoelectric conversion modules and the outer peripheral side surface of the outer peripheral side wall, the substance reducing contact thermal resistance between both.

7. The heat recovery device according to claim 1, wherein the honeycomb structure comprises a hollow portion that pierces from a central portion of the first end face to a central portion of the second end face to form a flow path for the first fluid, and the honeycomb structure has the cells on an outer peripheral side of the hollow portion.

8. The heat recovery device according to claim 7, wherein the heat recovery device comprises a branch path for branching a route for the first fluid passing through the honeycomb structure into a route passing through the hollow portion and a route passing through the cells.

9. The heat recovery device according to claim 8, wherein the heat recovery device comprises a valve capable of adjusting a flow rate ratio of the first fluid passing through the hollow portion and the first fluid passing through the cells.

10. The heat recovery device according to claim 7, comprising:
a guide tube extending from an upstream side of an inlet of the hollow portion to a vicinity of an outlet of the hollow portion;
a baffle plate disposed in the vicinity of the outlet of the hollow portion;
a first introduction port for guiding the first fluid to an outer peripheral side of the guide tube, the first introduction port being provided in the vicinity of the outlet of the hollow portion on an upstream side of the baffle plate;
a returning flow path formed between an inner peripheral wall of the honeycomb structure and an outer surface of the guide tube, the returning flow path being in communication with the first introduction port; and
a second introduction port for communicating the returning flow path to inlets of the cells on the first end face side.

11. The heat recovery device according to claim 1, wherein the first fluid is an exhaust gas from a combustion engine or a combustion device.

12. The heat recovery device according to claim 11, wherein the first fluid is an exhaust gas from a motor vehicle engine.

13. The heat recovery device according to claim 12, wherein the second fluid is cooling water that circulates between the engine and the heat recovery device.

14. The heat recovery device according to claim 1, wherein the tubular member is formed by winding a strip member around the outer peripheral side surface of the honeycomb structure and the one or more thermoelectric conversion modules.

15. A heat recovery system, comprising:
a one-way route for a first fluid;
a circulation route for a second fluid having a temperature lower than that of the first fluid;
the heat recovery device according to claim 1, disposed in the route for the first fluid and the route for the second fluid; and
a battery for storing electricity generated by the heat recovery device.

16. The heat recovery system according to claim 15, wherein the second fluid passes through a portion of a vehicle disposed in the route for the second fluid, the portion of the vehicle receiving heat in the second fluid.

17. The heat recovery system according to claim 16, wherein the portion of the vehicle receiving the heat from the second fluid is a radiator.

18. The heat recovery system according to claim 16, wherein the second fluid is cooling water for an engine and the portion of the vehicle receiving the heat from the second fluid is the engine.

19. The heat recovery system according to claim 15, wherein the route for the first fluid is an exhaust path from an engine, and an exhaust purification device using a catalyst is disposed in the exhaust path and on an upstream side of the heat recovery device.

* * * * *